United States Patent
Jansson

(10) Patent No.: US 6,655,021 B2
(45) Date of Patent: *Dec. 2, 2003

(54) METHOD AND APPARATUS FOR IMPROVING MOUNTING

(75) Inventor: Ulf Jansson, Åkersberga (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 102 days.

This patent is subject to a terminal disclaimer.

(21) Appl. No.: 09/826,018

(22) Filed: Apr. 5, 2001

(65) Prior Publication Data
US 2002/0050058 A1 May 2, 2002

(30) Foreign Application Priority Data
Apr. 6, 2000 (SE) .............................. 0001269

(51) Int. Cl.⁷ ................................ H05K 3/39
(52) U.S. Cl. ............................ 29/840; 29/825; 29/832; 29/593
(58) Field of Search .............. 29/832, 825, 840, 29/852, 593

(56) References Cited

U.S. PATENT DOCUMENTS

| | | | | |
|---|---|---|---|---|
| 3,387,365 A | * | 6/1968 | Stelmak | |
| 3,533,155 A | * | 10/1970 | Coucoulas | |
| 3,608,711 A | * | 9/1971 | Wiesler et al. | |
| 3,614,832 A | * | 10/1971 | Chance et al. | |
| 3,634,930 A | * | 1/1972 | Cranston et al. | |
| 3,859,723 A | * | 1/1975 | Hamer et al. | |
| 4,025,716 A | * | 5/1977 | Morse | |
| 4,386,464 A | * | 6/1983 | Yagi et al. | |
| 4,956,911 A | * | 9/1990 | Zarembs et al. | |
| 5,101,550 A | * | 4/1992 | Dunaway et al. | |
| 5,153,985 A | * | 10/1992 | Saraceni | |
| 5,566,840 A | | 10/1996 | Waldner et al. | |
| RE35,578 E | * | 8/1997 | Gloton et al. | |
| 5,690,504 A | | 11/1997 | Scanlan et al. | |
| 5,930,889 A | * | 8/1999 | Klein | |

FOREIGN PATENT DOCUMENTS

| | | |
|---|---|---|
| EP | 0376659 A1 | 7/1990 |
| FR | 2693339 A | 1/1994 |
| FR | 2741505 A | 5/1997 |
| WO | WO00/22897 PA | 4/2000 |

* cited by examiner

Primary Examiner—Carl J. Arbes

(57) ABSTRACT

The present invention relates to a method for fastening a printed board to an element. The method comprises the steps of: mounting at least one guide element to said printed board before said printed board is guided towards said element, fastening said at least one guide element to said printed board by soldering before said printed board is guided towards said element, and positioning said printed board on said element with the help of said at least one guide element. The invention also relates to a guide element for the method.

9 Claims, 4 Drawing Sheets

METHOD AND APPARATUS FOR IMPROVING MOUNTING

This application claims priority under 35 U.S.C. §§119 and/or 365 to 0001269-0 filed in Sweden on Apr. 6, 2000; the entire content of which is hereby incorporated by reference.

TECHNICAL FIELD OF THE INVENTION

The present invention generally relates to a method for fastening a printed board to an element and a guide element used in the method.

DESCRIPTION OF RELATED ART

The assembly process for an apparatus that comprises a printed board assembly involves several automatic assembly steps and often also at least some manual assembly steps. One of the assembly steps is to surface mount electronic components on a printed board. This is often done by applying a soldering paste on the printed board and automatically place the electronic components on the printed board in a so-called SMD-line by a so-called pick and place machine. After that, the electronic components are fixed to the printed board by soldering, for example in a soldering furnace. For the purpose of this patent application, the term 'electronic component' is used for various electric or electronic components such as capacitors, resistors, transistors and integrated circuit chips which could be mounted on a printed board to create a printed board assembly.

Another step in the assembly process is to fasten the printed board assembly to an element, such as a chassis, base plate or the like. For this purpose, the printed board and the element are provided with to each other corresponding holes for reception of a screw that secures a proper fastening of the printed board and the element to each other. The screwing action is often done by an automatic screw machine, which fasten screws at predetermined positions corresponding to the positions of the holes in the printed board and the element when the printed board assembly has been guided to a position on the element. The position of the printed board at this stage is very important since the automatic screw machine typically demands a tolerance zone of ±0.1 mm for the positions of the holes in the printed board and the element, in a horizontal plane in relation to an outer frame of reference, to be able to centre the screw in the hole and engage in corresponding threads in the hole. If the position of a hole deviates more than 0.1 mm, the screw may not engage in a corresponding receiving thread and it may also damage the printed board assembly and/or the element as it is forced downwards by the screw machine.

To ensure a sufficiently accurate positioning of the printed board assembly on the element, separate guide pins are pressed down in another set of holes in the element. When the printed board assembly is guided towards the element, these guide pins guide the printed board assembly with the help of a set of corresponding guide holes in the printed board. The insertion of a guide pin in one of the corresponding holes in the element is often done manually and the guide pin is secured to the hole by a press fit, which demands very small limits of tolerance for the contacting surfaces of the guide pin and the wall of the hole in the element. Moreover, the element, provided that it is e.g. a chassis, is often surface covered with a coating material in order to improve the electric conductibility between the element and the printed board assembly. This coating material often create bulges around the edges between the holes for the guide pins and the surface, as well as bulges inside the holes. In order to allow proper press fit, these bulges need to be smoothed. Therefore, small limits of tolerance for the guide pins and the corresponding holes in the element generate higher fabrication costs than guide pins and holes with larger limits of tolerance. Also, the manual insertion makes great demands upon a worker when inserting a guide pin, since the press fit easily gives a slight inclination from the desired guide direction of the guide pin. The inclination might cause inaccurate positioning of the printed board assembly. Of course the same demands are true for an automatic guide pin inserting machine, if it is to replace the worker.

Alternatively, but less common, the element is provided with integrated guides for the guide holes in the printed board. Thereby the step of inserting a guide pin in a corresponding hole is avoided, but causes other disadvantages. The element, to which the printed board assembly is to be fastened, is often made of metal in order to conduct heat away from a printed board assembly in use and to improve the earthing. Such metal elements, such as chassis, are fabricated in advanced pre-programmed automatic machines, such as a CNC-machine, which is expensive to use and maintain. Small details, such as protruding integrated guides on a flat surface, give a much longer, in many cases unacceptable, fabrication time in the CNC-machine. Also, larger pieces of raw material have to be used.

Although the two above alternative procedures relates to a fastening of a printed board assembly, the same problems and disadvantages of the procedures are also true for a printed board.

In EP-376659-A1 a similar problem with separate guide pins is discussed in the field of multicontact connectors that use a base frame in which guide pins are press-fitted for guiding a large scale integrated circuit package. The guide pins are individually received in reference holes formed through a printed circuit board, whereby the base frame is positioned relative to the printed circuit board.

SUMMARY

It is therefore a general object of the present invention to provide a method and a guide element for fastening a printed board or a printed board assembly in order to solve the above mentioned accuracy problems and disadvantages.

Another general object is to provide an improved method and a guide element that makes the fastening more effective in terms of cost and assembly time.

The invention therefore provide a method for fastening a printed board to an element, where the method comprises the steps of: mounting at least one guide element to the printed board before the printed board is guided towards the element, fastening the at least one guide element to the printed board by soldering before the printed board is guided towards the element, and positioning the printed board on the element with the help of the at least one guide element. Thus a difficult manual or automatic insertion of separate guide pins in the element, as mentioned in the 'Description of related art', is avoided.

Suitably, the method further comprises the steps of: positioning at least one cover on top of the printed board with the help of the at least one guide element; and fastening the printed board and the at least one cover to the element by at least one fastener, for example at least one screw that is screwed into to each other corresponding holes in the at least one cover, the printed board and the element. Hereby is achieved that the guide element also is used for positioning a cover, which preferably protects the essential parts of the printed board.

Preferably, the method further comprises the steps of: mounting at least one electronic component on the printed board before the printed board is guided towards the element, and fastening the at least one electronic component to the printed board by soldering. Hereby is achieved that the electronic component and the guide element suitably are placed during the same step and also soldered to the printed board during a common step.

Advantageously, the at least one guide element and the at least one electronic component are mounted by an automatic apparatus, such as a so-called pick and place machine, and the at least one electronic component is surface-mounted.

If needed, the method comprises the steps of: mounting at least one mechanical component on the printed board before the printed board is guided towards the element and fastening the at least one mechanical component to the printed board by soldering. The at least one mechanical component is mounted by an automatic apparatus, such as a so-called pick and place machine, and the at least one mechanical component is surface mounted. Hereby is achieved that electronic components, guide elements, and mechanical components, such as shields for electromagnetism, suitably are placed during the same step and may be soldered to the printed board during a common step.

Suitably the at least one guide element is mounted to the printed board by being inserted into a corresponding through-hole in the printed board. This allows larger limits of tolerance than the press fit between a guide pin and an element as mentioned above, since capillary effects from solder paste during the soldering encourage a centering of the guide element in the through-hole.

The invention also provides a guide element for the method according to the invention. The guide element comprises at least one solder surface, which preferably is flat, adapted to be soldered to a printed board in order to fasten the guide element to the printed board by soldering, and at least one guide surface adapted to guide the printed board into a position in relation to an element, to which the printed board is to be fastened. Preferably the at least one guide surface is cylindrical in order to fit a corresponding through-hole in the printed board and the element.

To facilitate insertion of the guide element in a corresponding hole in the element, the guide element comprises an end section with a conical or frusto-conical shape.

Suitably, the guide element comprises at least one flange that directs and positions the guide element in a desired direction and desired position relative to the printed board when the guide element is placed in a hole in the printed board. Moreover, the flange may be substantially perpendicular to a longitudinal axis of the guide element and preferably comprises the at least one solder surface. Furthermore the flange may be positioned substantially in the centre of the guide element in the longitudinal direction of said guide element.

In order to guide, for example, a cover placed over the printed board and facilitate insertion of the guide element in the cover, the guide element comprises a second end section with a substantially conical or frusto-conical shape.

If required, at least one of the end sections comprises at least one slot which divide the end section into axially extending fingers that are deflectable substantially radially inwards.

BRIEF DESCRIPTION OF THE DRAWINGS

The objects, advantages and effects as well as features of the present invention will be more readily understood from the following detailed description of a preferred method and guide element, as well as other embodiments, when read together with the accompanying drawings in which.

DETAILED DESCRIPTION OF EMBODIMENTS

Figure 1:
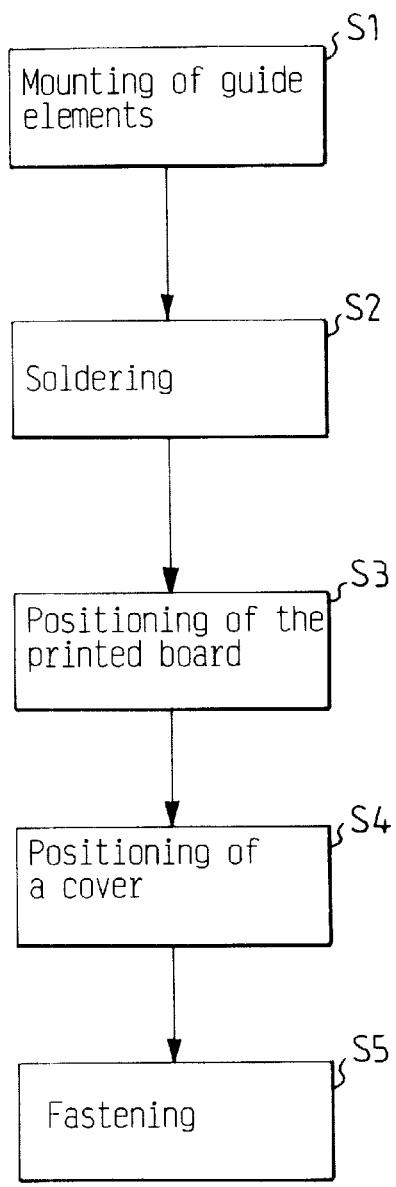
FIG. 1 shows a schematic block diagram of a preferred method according to the invention.

While the invention covers various modifications and alternative constructions, preferred embodiments of the invention are shown in the drawings and will hereinafter be described in detail. It is to be understood, however, that the specific description and drawings are not intended to limit the invention to the specific forms disclosed. On the contrary, it is intended that the scope of the claimed invention include all modifications and alternative constructions thereof falling within the spirit and scope of the invention as expressed in the appended claims to the full range of their equivalents.

FIG. 1 shows a schematic block diagram of a preferred method for fastening a printed board to an element, where the method is divided into five principal steps S1–S5. Before the first step, a printed board 1 has been fabricated and a solder paste has been applied to at least one side of the printed board 1. Such a method is known in the prior art and is not described further.

Step S1 comprises mounting of guide elements 2 to the printed board 1. If electronic components 3 and mechanical components 4 are to be mounted, for example by surface mounting, this is preferably done in this step too. The electronic components 3, the mechanical components 4 and the guide elements 2 are picked from a tape and reel or a tray and placed on the printed board 1 by an automatic machine, such as a pick-and place machine that picks up the electric components 3, the mechanical components 4 and the guide elements 2 by a negative pressure action. By applying the guide elements 2 in the same step as the electronic and mechanical components 3, 4, a whole step for applying guide pins on an element 5 to which the printed board 1 is to be fastened, is avoided. This saves assembly time as well as a worker or an apparatus for pressing guide pins into holes in the element 5.

In step S2, the electronic components 3, the mechanical components 4, and the guide elements 2 are soldered. This is preferably done at the same time in a soldering furnace. Thereby, the guide elements 2 are fixed to the printed board 1 in a proper position, and a printed board assembly is now ready for the next step.

Step S3 is a positioning of the printed board assembly on the element 5. One section of a guide element 2 is guided into a corresponding hole 6 in the element 5.

Step S4 involves a positioning of a cover 7 on top of at least a part of the printed board assembly. Preferably, the guide element 2 also guides the cover 7 with the help of guide holes 8 (see FIG. 4 and below) in the cover 7 for receiving a section of the guide elements 2.

When the element 5, the printed board assembly and the cover 7 have been properly positioned in relation to each other, an automatic screw machine fastens the printed board assembly and the cover 7 to the element 5 by screwing a fastener, e.g. a screw or a bolt, into corresponding holes in the cover 7, the printed board assembly and the element 5. This is done in step S5.

Figure 2:
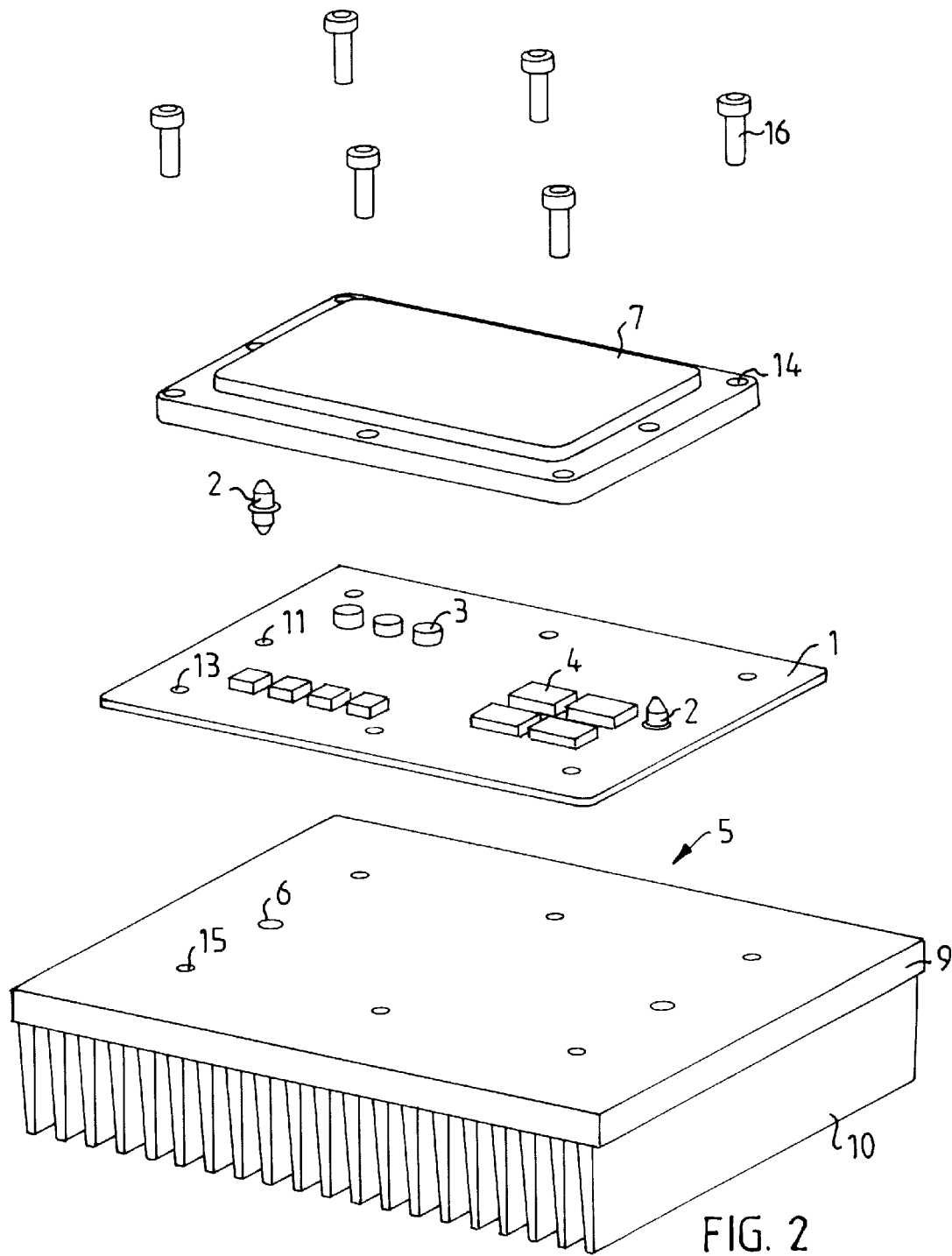
FIG. 2 shows an exploded diagram of a printed board assembly and cover that are to be mounted to a base plate according to the invention.

For a better understanding of the main structural parts involved in the invention, FIG. 2 shows an exploded diagram with: a printed board 1 with mounted electronic components 3 and mechanical components 4, i.e. a printed board assembly; two guide elements 2; an element 5 in the form of a metallic heat sink with a base plate 9 and cooling fins 10; and a cover 7. One guide element 2 is here shown separated from the printed board assembly only to illustrate that the guide elements 2 are separate elements and the subject of an independent claim; but as stated above, they are soldered to the printed board. As clearly shown in FIG. 2 or FIG. 4, the guide elements 2 correspond to a first set of through-holes 11 in the printed board 1. The guide elements 2 are placed in these through-holes 11 from above and are prevented from completely passing through by an integrated flange 12 on the guide elements 2 (see FIGS. 5–9). However, it is to be understood that the method according to the invention also allows guide elements 2 to be placed from below and soldered to the printed board 1, especially if no electronic or mechanical components 3, 4 are to be mounted. A second set of through-holes 13 in the printed board 1 corresponds to through-holes 14 in the cover 7 and holes 15 in the base plate 9. All these corresponding holes 13, 14, 15 are used for the reception of a screw 16 for fastening the cover 7 and the printed board assembly to the base plate 9.

Figure 3:
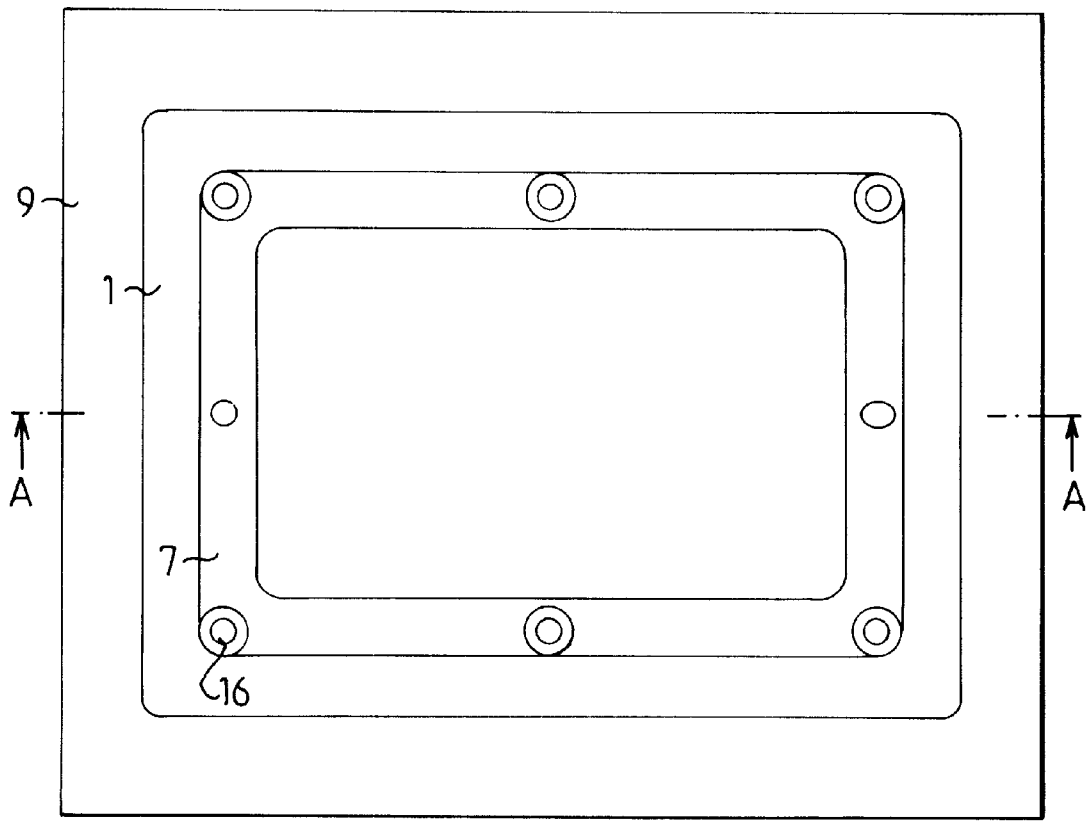
FIG. 3 shows a view from above of the assembly in a mounted state according to FIG. 2.

FIG. 3 shows a view from above of the position of the printed board assembly in relation to the base plate 9 and the cover 7, after the printed board assembly and the cover 7 have been guided to their predetermined end positions in relation to the base plate 9. The cover 7 only protects the essential parts of the printed board assembly in order to save material when fabricating the cover 7 and to improve the cooling of the printed board assembly. If desired, the cover may of course protect the whole printed board assembly, or a plurality of smaller covers may be fastened to the printed board 1 in order to cover only a few electric components 3. Also note that the method according to the invention may be performed without the cover 7, i.e. only a fastening of the printed board assembly to the base plate 9 is required.

Figure 4:
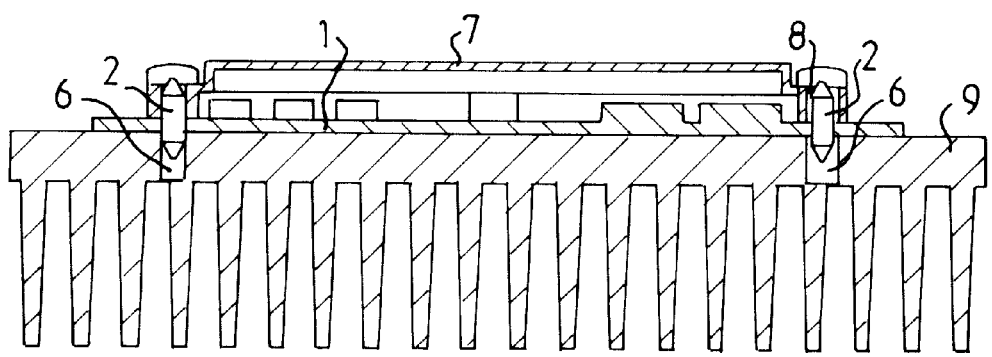
FIG. 4 shows a cross sectional view taken along line A—A of FIG. 3.

As earlier mentioned but best seen in FIG. 4, the guide elements have one section inside a set of holes 6 in the base plate 9 and another section inside a set of holes 8 in the cover 7 when the cover 7 and the printed board assembly are in their end positions.

Figure 5:
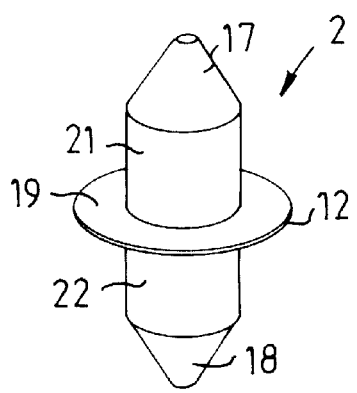
FIG. 5 shows a perspective view of a preferred embodiment of the guide element according to the invention.
Figure 6:
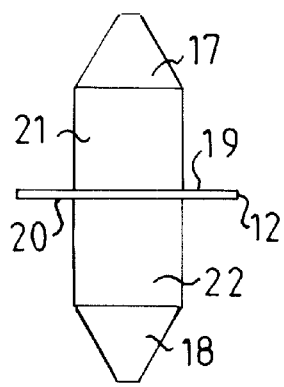
FIG. 6 shows a side view of the preferred embodiment of the guide element.

As seen in FIG. 5, a guide element 2 according to a preferred embodiment of the invention comprises: a first and a second end section, 17 and 18, with a substantially conical or frusto-conical shape, a ring-shaped flange 12 with two equally sized flat parallel surfaces 19 and 20, and two cylindrical guide surfaces 21 and 22. The guide element 2 is made from one piece of metal or metal alloy. The flange 12 is positioned in the middle of the guide element 2 in the longitudinal direction, so as to create a symmetrical double acting guide element, i.e. the flat parallel surfaces 19, 20 are substantially perpendicular to the longitudinal axis of the guide element 2. As seen in FIG. 6, the lower (20) of the two parallel surfaces is a solder surface for contacting the upper surface of the printed board 1, but since the guide element 2 according to the preferred embodiment is symmetrical, it does not matter which one of the two end parts 17, 18 that is inserted into the base plate 9.

Figure 7:
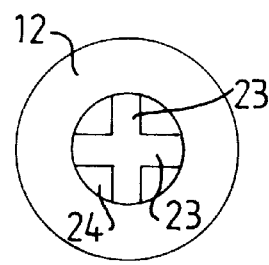
FIG. 7 shows a plan view of another embodiment of the guide element.

FIG. 7 shows a view from above of another embodiment of the guide element 2. Here, at least the upper conical end section comprises two slots 23, which create four substantially equally shaped fingers 24 that are slightly deflectable radially inwards.

Figure 8:
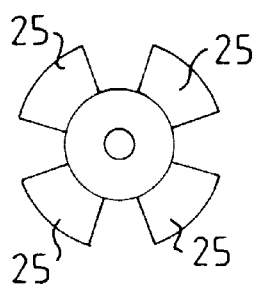
FIG. 8 shows a plan view of yet another embodiment of the guide element.

FIG. 8 shows a view from above of another embodiment of the guide element 2. Here, four flanges 25 that together have the same features as the ring-shaped flange 12, are equiangularly positioned about the longitudinal axis of the guide element 2 and have the same longitudinal position in relation to each other. This embodiment gives, for example, a lighter guide element 2.

Although only two examples of the shape of a flange are shown, it is to be understood that the flange according to the invention may have any shape such as a square, triangle, or other kinds of a polygonal shape. Also, the surfaces do not have to be flat, but may be bent or curved so as to form a desired solder surface as well as any contact surface with the cover 7. The number of flanges may of course also be chosen to any desired number. It is also to be understood that the guide element 2 may be hollow and thin-walled in order to provide a light weight guide element. Also the guide surfaces 21 and 22 do not have to be cylindrical; they may have any cross section shape, such as a regular or irregular polygonal shape. That means that the holes 6 in the element 5 do not have to be circular, but may correspond to the contour of the guide surface 22 and thereby have e.g. an oblong, oval or elliptical shape.

Figure 9:
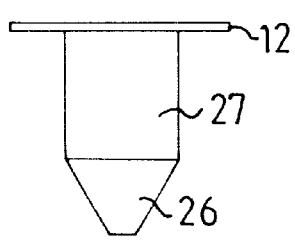
FIG. 9 shows a side view of still another embodiment of the guide element.

FIG. 9 shows a guide element that may be used in the method where no cover 7 is positioned on top of the printed board assembly. The guide element 2 only has one substantially conical or frusto-conical end section 26 and a cylindrical guide section 27. A flange 12 is here positioned at an end of the cylindrical guide section, but could of course be positioned anywhere along the longitudinal axis of the guide element 2 as long as the flange 12 serves the above mentioned purposes.

Figure 10:
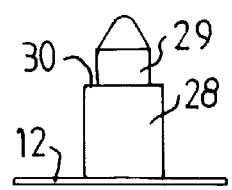
FIG. 10 shows a side view of a fifth embodiment of the guide element.

FIGS. 10–13 shows other embodiments of the guide element according to the invention. These embodiments may be used when a cover 7 is not intended to benefit from the guide elements. The embodiment shown in FIG. 10 is designed for allowing guidance and a space between the element 5 and the printed board 1. Therefore, this embodiment comprises a flange 12 at a first end of a cylindrical first guide surface 28, which together with the flange 12 direct the guide element to the right position in relation to the printed board during soldering. A cylindrical second guide surface 29 is connected to the first guide surface 28 at a second end of the first guide surface 28. The second guide surface has substantially the same diameter as the hole 6 in the element 5. To provide a distance between the printed board 1 and the element 5, the diameter of the second guide surface 29 is less than the diameter of the first guide surface 28 so as to provide a ring-shaped shoulder 30 intended for contact with the surface of the element 5 facing the printed board 1. The shoulder 30 is suitably fastened to the element 5 by soldering. As in the previously shown embodiments, this embodiment also comprises a conical or frusto-conical end section.

Figure 11:
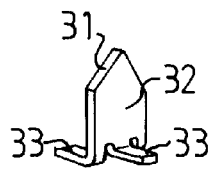
FIG. 11 shows a perspective view of a sixth embodiment of the guide element.

The embodiment shown in FIG. 11 is a folded sheet of metal. This guide element has a substantially flat and pointed end section 31 and a substantially flat main section 32 providing four guide surfaces substantially perpendicular to each other. Three flanges 33 (only two are seen in FIG. 11) are folded from the sheet of metal in such a way that they are essentially perpendicular to the end section 31 and the main section 32. The flanges 33 have the same purpose as the flanges in the other embodiments. This embodiment is an example of a guide element that could be provided if the holes 6 in the element 5 and the holes 11 in the printed board 1 are oblong.

Figure 12:
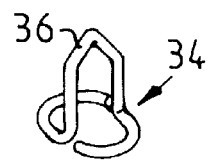
FIG. 12 shows a perspective view of a seventh embodiment of the guide element.
Figure 13:
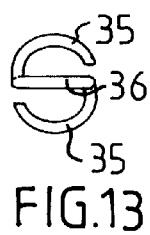
FIG. 13 shows a plan view of the seventh embodiment of the guide element.

The embodiment shown in FIGS. 12 and 13 is yet another example of a guide element that may be used in the method according to the invention. This guide element is manufactured from a piece of wire 34, which is bent in such a way that end parts 35 are circularly bent in opposite directions and extending perpendicularly to a middle part 36. The middle part 36 is bent to comprise two parallel sections and a section that is positioned in the same plane as the two parallel sections, but is bent to provide a pointed insertion end. The end parts 35 comprise a solder surface respectively and the middle part 36 comprises a guide surface with the same purpose as the guide surfaces of the other embodiments.

Although the guide elements preferably are made out of a single piece due to manufacturing simplicity and not adding further tolerance requirements, the guide pins could of course be manufactured from two or more different pieces of different materials.

Figure 14:
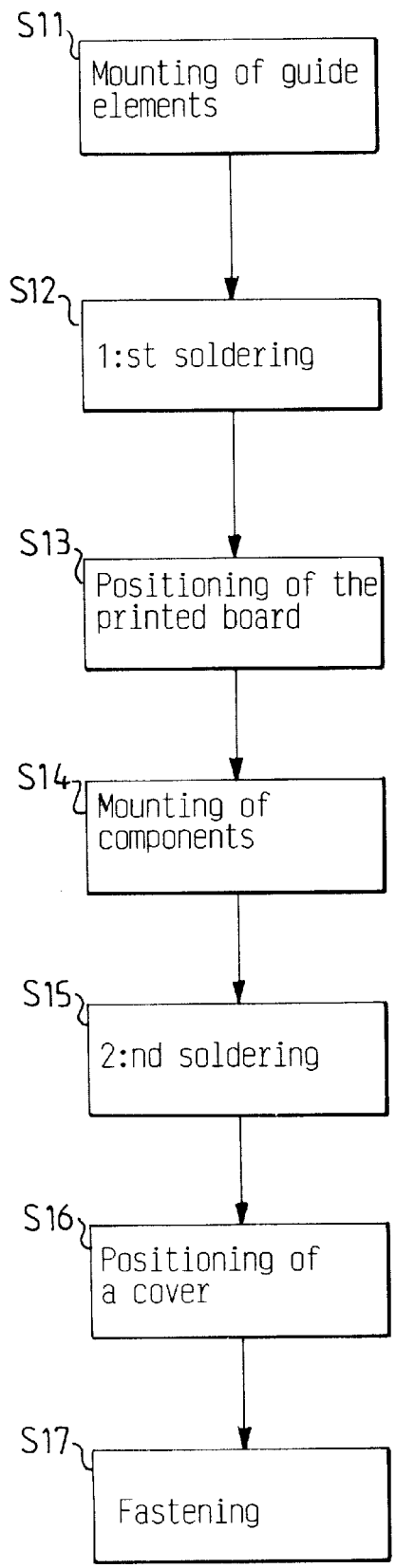
FIG. 14 shows a schematic block diagram of a method according to the invention.

FIG. 14 shows a second method according to the invention having seven steps S11–S17 if the cover 6 is to be fastened to the element 5. Step S11 comprises the mounting of the at least one guide element 2 in the same way as in step S1. Step S12 comprises the soldering of the at least one guide element 2 to the printed board 1 in the same way as in S2. Step S13 comprises the positioning of the printed board 1 on the element in the same way as in S3. Step S14 comprises mounting, preferably surface mounting, of at least one electronic component 3 and, if needed, at least one mechanical component 4 on the printed board. After that, in step S15, the whole assembly including the element 5, the printed board 1, the at least one electronic component 3 and the at least one already soldered guide pin 2, is put into a soldering furnace where the at least one electronic component 3 and mechanical component 4 are soldered to the printed board 1 and the printed board is soldered to the element 5. The soldering of the printed board 1 to the element 5, which in one example above is a heat sink, improves the heat conducting between the printed board 1 and the element 5. Also, if desired, this fastening of the printed board 1 to the element 5 counteract a bending of the printed board 1 on the element 5, of course provided that the element 5 is not being bent. The disadvantage with this method in relation to the first described method (S1-S5) is that this method requires two soldering steps and two mounting steps, if electronic and mechanical components 3, 4 are to be mounted. The steps S16 and S17 correspond to the steps S4 and S5 respectively.

What is claimed is:

1. A method for fastening a printed board to an element, comprising the steps of:

mounting at least one guide element to said printed board before said printed board is guided towards said element;

fastening said at least one guide element to said printed board by soldering before said printed board is guided towards said element; and positioning said printed board on said element with the help of said at least one guide element.

2. A method according to claim 1, further comprising the steps of:

positioning at least one cover on top of said printed board with the help of said at least one guide element; and fastening said printed board and said at least one cover to said element by at least one fastener, for example at least one screw that is screwed into to each other corresponding holes in said at least one cover, said printed board and said element.

3. A method according to claim 1, further comprising the steps of:

mounting at least one electronic component on said printed board before said printed board is guided towards said element; and fastening said at least one electronic component to said printed board by soldering.

4. A method according to claim 3, where said at least one guide element and said at least one electronic component are mounted by an automatic apparatus, such as a so-called pick and place machine.

5. A method according to claim 3, where said at least one electronic component is surface-mounted.

6. A method according to claim 3, further comprising the steps of:

mounting at least one mechanical component on said printed board before said printed board is guided towards said element; and fastening said at least one mechanical component to said printed board by soldering.

7. A method according to claim 6, where said at least one mechanical component is mounted by an automatic apparatus, such as a so-called pick and place machine.

8. A method according to claim 6, where said at least one mechanical component is surface-mounted.

9. A method according to claim 1, where said at least one guide element is mounted to said printed board by being inserted into a corresponding through-hole in said printed board.

* * * * *